United States Patent [19]

House

[11] Patent Number: 4,809,338

[45] Date of Patent: Feb. 28, 1989

[54] AUTOMOTIVE SOUND SYSTEM

[75] Inventor: William N. House, Bloomington, Ind.

[73] Assignee: Harman International Industries, Incorporated, Northridge, Calif.

[21] Appl. No.: 916,959

[22] Filed: Oct. 8, 1986

Related U.S. Application Data

[63] Continuation-in-part of Ser. No. 752,058, Jul. 5, 1985, abandoned.

[51] Int. Cl.$^4$ .............................................. H03G 5/00
[52] U.S. Cl. ...................................... 381/103; 381/86; 381/24
[58] Field of Search .................. 381/96, 106, 98, 103, 381/24, 80, 86, 102, 101

[56] References Cited

U.S. PATENT DOCUMENTS

| | | |
|---|---|---|
| 2,045,300 | 6/1936 | Koch . |
| 2,134,059 | 10/1938 | Schade . |
| 2,167,011 | 7/1939 | Tellegen . |
| 2,173,426 | 9/1939 | Scott . |
| 2,190,318 | 2/1940 | Kellogg . |
| 2,606,969 | 8/1952 | Scott . |
| 2,606,970 | 8/1952 | Scott . |
| 2,606,971 | 8/1952 | Scott . |
| 2,606,973 | 8/1952 | Scott . |
| 2,759,049 | 8/1956 | Scott . |
| 2,948,778 | 8/1960 | Clements . |
| 3,281,723 | 10/1966 | Mercer . |
| 3,290,442 | 12/1966 | Suganuma . |
| 3,334,184 | 8/1967 | DeKoning . |
| 3,449,518 | 6/1969 | Erath . |
| 3,452,282 | 6/1969 | Beres . |
| 3,497,621 | 2/1970 | Erath . |
| 3,497,622 | 2/1970 | Markin et al. . |
| 3,530,244 | 9/1970 | Reiffin . |
| 3,571,529 | 3/1971 | Gharib et al. . |
| 3,665,345 | 5/1972 | Dolby . |
| 3,678,416 | 7/1972 | Burwen . |
| 3,753,159 | 8/1973 | Burwen . |
| 3,798,374 | 3/1974 | Meyers . |
| 3,803,359 | 4/1974 | Corderman . |
| 3,803,423 | 4/1974 | Libby . |
| 3,821,473 | 6/1974 | Mullins . |

(List continued on next page.)

FOREIGN PATENT DOCUMENTS

| | | |
|---|---|---|
| 877167 | 10/1979 | Belgium . |
| 1299328 | 7/1969 | Fed. Rep. of Germany . |
| 2332649 | 6/1977 | France . |
| 52-89045 | 7/1977 | Japan . |
| 56-15186 | 8/1982 | Japan . |
| 1367002 | 8/1974 | United Kingdom . |
| 1520156 | 8/1978 | United Kingdom . |

OTHER PUBLICATIONS

Lancaster, TTL Cookbook, 1980, p. 168.
Grundig Techn. Informationen, vo. 27, No. 1/2, 1980, pp. 90–94 Furth; H. Sinning: "Die Grundig–Auto–Aktivbox L/U 300 HiFi".

Primary Examiner—F. W. Isen
Attorney, Agent, or Firm—Barnes & Thornburg

[57] ABSTRACT

A sound system comprises a source of program material, a transducer coupled to the source to produce an audible signal related to the program material, a controllable bass contour control network having a control terminal, a power amplifier, a second transducer and a low pass filter. The controllable bass contour control network is coupled to the program material source. The power amplifier is coupled to the controllable bass contour control network. The second transducer and the low pass filter are coupled to the power amplifier. The low pass filter is coupled to the control terminal of the controllable bass contour control network. The output of the lower pass filter controls the contour of the signal supplied from the program material source through the controllable bass contour control network to the power amplifier based upon the signal provided by the power amplifier to the low pass filter. The control terminal comprises a terminal of a light sensitive resistor. The low pass filter further comprises a light emitting device. The low pass filter is coupled to the control terminal of the controllable bass contour control network by coupling light from the light emitting device to the light sensitive resistor.

6 Claims, 3 Drawing Sheets

U.S. PATENT DOCUMENTS

| | | |
|---|---|---|
| 3,889,060 | 6/1975 | Goto et al. . |
| 3,890,465 | 6/1975 | Kaizu . |
| 3,911,371 | 10/1975 | Nakamura et al. . |
| 3,921,077 | 11/1975 | Suzuki . |
| 3,925,708 | 12/1975 | Picciochi . |
| 3,934,085 | 1/1976 | Munson et al. . |
| 3,937,887 | 2/1976 | Miller . |
| 3,939,428 | 2/1976 | Shimizu et al. . |
| 3,959,735 | 5/1976 | GrosJean . |
| 3,967,219 | 6/1976 | Dolby . |
| 3,991,370 | 11/1976 | Pate . |
| 3,997,724 | 12/1976 | Seebinger . |
| 4,061,874 | 12/1977 | Fricke et al. . |
| 4,113,983 | 9/1978 | Steel . |
| 4,127,743 | 11/1978 | Ozawa et al. . |
| 4,163,119 | 7/1979 | Baba et al. . |
| 4,225,822 | 9/1980 | Kariatsumari . |
| 4,247,955 | 1/1981 | Weidemann . |
| 4,296,278 | 10/1981 | Cullison et al. . |
| 4,301,330 | 11/1981 | Trump . |
| 4,327,250 | 4/1982 | von Recklinhausen . |
| 4,330,686 | 5/1982 | Roe . |
| 4,342,023 | 7/1982 | Tsunoda et al. . |
| 4,408,095 | 10/1983 | Ariga et al. . |
| 4,490,691 | 12/1984 | Dolby ................................. 381/106 |
| 4,583,245 | 4/1986 | Gelow et al. ......................... 381/96 |

AUTOMOTIVE SOUND SYSTEM

This application Ser. No. 06/752,058 filed July 5, 1985, now abandoned.

This invention relates to automotive sound systems, and particularly to a system which employs psychoacoustic contouring of the program material signal, based upon the hearing characteristics of the human ear.

It has long been known that the apparent response of the human ear is dependent upon how loud program material is, and the frequency of that program material. For example, it is known that, at low program material loudness levels, low frequency program material is much lower in apparent volume than higher frequency program material. As loudness level increases, the apparent difference in loudness between equal amplitude low frequency program material signals and high frequency program material signals diminishes. Equalization based upon the so-called Fletcher-Munson characteristics, or some other characteristics has been utilized in the past. Another set of differential loudness contours, the Stephens differential loudness contours, is also known.

Invariably, in the design of an audio system for an automotive vehicle, certain compromises are made. The acoustic environment of an automobile is a unique environment. It is small, fully enclosed and relatively noisy. There are surfaces in the vehicle that are highly absorptive, such as car seats, padded dashboards and headliners. There are surfaces in a car that are highly reflective, such as window glass. There are size and placement constraints on the choice of loudspeakers to play within the environment of an automobile.

Certain design advantages, however, are available in the automotive sound system environment. For example, the designer knows generally where the occupants of the car are going to be seated. Therefore, specific equalization of a system at the intended location of the listener's ear can be achieved. The relatively small enclosed space of an automobile interior can be used to good advantage in terms of bandwidth with proper system design.

One demand for a high-quality automotive sound system is that the bandwidth of the system be as wide as possible. Much musical information otherwise can be masked or lost in a system that is "midrange-heavy," has acoustic dips or "notches", or does not reproduce high or low frequencies with maximum fidelity.

To deal with the sound absorption characteristics of an automobile interior, it is essential when designing an automotive sound system to address the true sound power generated by the speakers mounted in the automobile. Since speakers generally become more directional as frequency of program material increases, the sound power radiated as frequency increases is radiated in a narrower and narrower beam. This is due to deffraction effects around the speaker circumference. Generally, the smaller the speaker, the less the deffraction effects. The contributions of off-axis sound pressure response become more and more critical as speaker mounting location considerations restrict the ideal placement of speakers. The restrictions can lead to a shift of the stereo image and increased intermodulation distortion due to the bandwidth limitations of the speakers. In situations in which the speaker size and location are restricted, the bandwidth of the speakers must be well controlled.

In accordance with the present invention, in a sound system comprising a source of program material, a first transducer, and means for coupling the first transducer to the source to produce an audible signal related to the program material, the improvement comprises a variable bass contour control network, a power amplifier, a second transducer and a control circuit. Means are provided for coupling the variable bass contour control network to the program material source. Additional means are provided for coupling the power amplifier to the variable bass contour control network. Further means are provided for coupling the second transducer and the control circuit to the power amplifier. The control circuit is coupled to the variable bass contour control network, the control circuit controlling the contour of the signal supplied from the program material source through the variable bass contour control network to the power amplifier based upon the signal provided by the power amplifier to the control circuit.

According to an illustrative embodiment of the invention, the power amplifier comprises a pair of output terminals and the means for coupling the second transducer and control circuit to the power amplifier comprises means for coupling the second transducer and control in parallel across the output terminals.

Further according to an illustrative embodiment, the variable bass contour control network comprises a light sensitive resistor, the control circuit comprises a light emitting device, and the control circuit is coupled to the variable bass contour control network by coupling light from the light emitting device to the light sensitive resistor.

Additionally, according to an illustrative embodiment, the control circuit further comprises a low pass filter, means for coupling the low pass filter across the output terminals, a rectifier, means for coupling the rectifier across the low pass filter, means for storing the rectified voltage variations appearing across the rectifier, means for coupling the storage means to the rectifier and current limiting means for coupling the light emitting device across the storage means to limit the light output from the light emitting device for a given stored energy in the storage means.

Illustratively, the variable bass contour control network comprises a bass boost circuit, a notch filter, a band pass filter and a low frequency boost-attenuator.

Additionally, according to the invention, the source of program material has a plurality of output channels, and there are an equal plurality of first-mentioned transducers, variable bass contour control networks, power amplifiers, second transducers and control circuits. According to an illustrative embodiment, there are four each of said output channels, said first-mentioned transducers, said variable bass contour control networks, said power amplifiers, said second transducers and said control circuits.

The system of the present invention comprises four speaker-amplifier modules used in conjunction with an electronically tunable radio (ETR) "head end." The system of the present invention utilizes four high-frequency and four low-frequency transducers. Each low-frequency tranducer has a separate amplifier in a quasi-biamplification mode. The four high-frequency output channels illustratively are the ETR's four channels (right front, left front, right rear and left rear). The low-frequency channels tap directly into respective high-frequency channels between the ETR output and the respective channel's high-frequency transducer. As used herein, "high-frequency transducer" includes each of the four mid-woofer/tweeter combinations which ordinarily accompany an ETR when an automotive vehicle is provided with an ETR. The four low-frequency amplifiers and transducers which the present invention adds to the normal complement of speakers which accompany the ETR are mounted in the automotive vehicle adjacent the original equipment speakers, and extend the bass response of the original equipment sound system.

Each bass control amplifier is a high-level, class B, bridge-type audio amplifier with closed-loop loudness compensation control. The amplifier, designed for automotive sound applications, operates from the vehicle's supply voltage, illustratively +12 VDC, has a maximum current capacity of 4.5 amperes and operates into a load of 3.2 ohms to 16 ohms. The amplifier is internally protected against excess voltage and current. The amplifier can provide 15 watts (RMS) output power into a 4 ohm load in a frequency range of 20 Hz–20 KHz with less than 0.5% total harmonic distortion.

The loudness control, which forms a part of each bass control amplifier is provided to enhance the sound quality available from the original equipment ETR and its associated complement of speakers at lower signal levels. That is, the loudness control is designed to provide Stephens differential loudness contour compensation in the output of the bass control and to overcome noise masking in the automotive vehicle environment.

Thus, the bass control amplifier for each of the four channels according to the present invention comprises a basic class B bridge-type audio amplifier, a power supply filter which operates from the +12 VDC automotive vehicle supply to reduce supply transients and ripple, an input equalization network which provides the desired frequency response characteristics, including low pass filter characteristic, band pass characteristic and a low-frequency boost-attenuation network, and the control circuitry which controls the frequency and level of the control voltage for loudness contour and noise masking compensation.

The invention may best be understood by referring to the following description and accompanying drawings which illustrate the invention. In the drawings.

Figure 1:
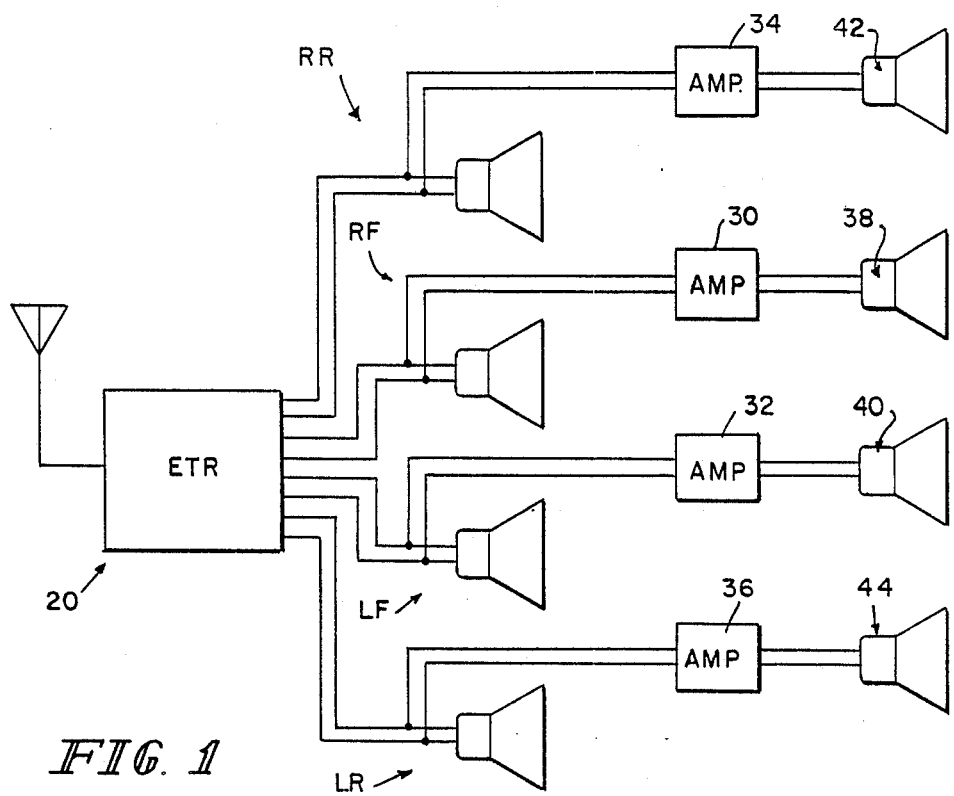
FIG. 1 illustrates a partly block and partly schematic diagram of a system constructed according to the invention.

As best illustrated in FIG. 1, a block diagram of a system constructed according to the present invention, the system includes an electronically tunable radio (ETR), such as the Model 4311-103 "ultimate radio" available from Chrysler Corporation. ETR 20 provides four output channels, illustratively, right front (RF), left front (LF), right rear (RR) and left rear (LR). These output channels of the ETR 20 drive directly four speaker assemblies 22, 24, 26, 28, respectively, from channels RF, LF, RR, LR. The signals in the output channels of the ETR 20 are also coupled to input terminals of bass control amplifiers 30, 32, 34, 36, respectively. The output terminals of bass control amplifiers 30, 32, 34, 36 are coupled to respective bass assemblies 38, 40, 42, 44. The system of FIG. 1 thus provides biamplification, with additional bass contouring, for the program material in the output channels RF, LF, RR, LR of ETR 20.

Figure 2:
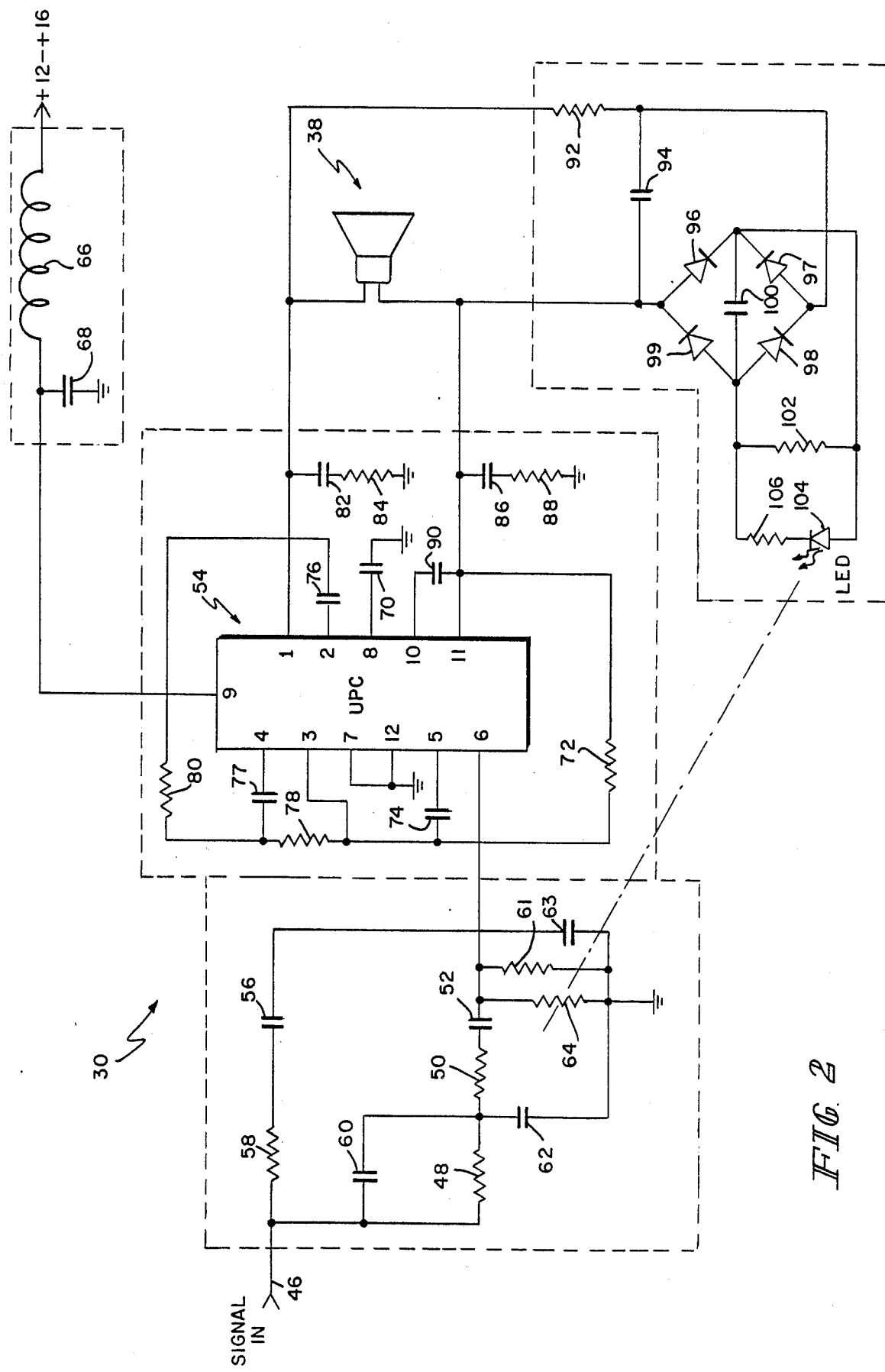
FIG. 2 illustrates a partly block and partly schematic diagram a portion of the system illustrated in FIG. 1.

An examination of FIG. 2 will aid in understanding this biamplification and further contouring of the bass program material in the respective channels. FIG. 2 illustrates a partly block and partly schematic diagram of one of the amplifiers 30, 32, 34, 36, illustratively amplifier 30. It is to be understood that four such channels would be provided in a complete four-channel system. An input terminal 46 of this amplifier, illustratively, amplifier 30, is coupled through a series circuit including a resistor 48, a 10K resistor 50 and a 1 μF capacitor 52 to an input terminal, pin 6, of a power amplifier integrated circuit 54. Illustratively, integrated circuit 54 is a type uPC1230H2 amplifier available from NEC. The pin numbers given in this description are for such an amplifier, although it is to be understood that any other suitable amplifier can be used.

A series RC circuit, including a capacitor 56 and a resistor 58 is coupled in parallel with the series components 48, 50, 52. A capacitor 60 is coupled in parallel with resistor 48. A capacitor 62 is coupled from the common terminal of resistor 48, resistor 50 and capacitor 60 to ground. A light sensitive resistor 64 is coupled between pin 6 of integrated circuit 54 and ground. A parallel RC circuit including a resistor 61 and a capacitor 63 is also coupled between pin 6 and ground.

Power is supplied from an unregulated +12 — — +16 VDC supply, such as an automobile battery, through a 0.1 mH choke 66 to the power supply terminal, pin 9 of integrated circuit 54. A 100 μF capacitor 68 is coupled between pin 9 and ground.

A 50 μF capacitor 70 is coupled between pin 8 of integrated circuit 54 and ground. A 1.5K resistor 72 is coupled between pins 3 and 11 of integrated circuit 54. A 100 μF capacitor 74 is coupled between pins 3 and 5 of integrated circuit 54. A 100 μF capacitor 76 is coupled between pins 1 and 2 of integrated circuit 54. A 100 μF capacitor 77 and an 18 ohm resistor 78 are coupled in series between pins 3 and 4 of integrated circuit 54. A 3.3K of integrated circuit 54 and the common terminal of capacitor 77 and resistor 78. Pins 7 and 12 of integrated circuit 54 are coupled to ground. A bass speaker assembly, illustratively, speaker assembly 38, is coupled across the output terminals, pins 1 and 11 of integrated circuit 54. Each of pins 1 and 11 is coupled to ground through a series RC circuit including a 0.1 μF capacitor 82 and a 1 ohm resistor 84 (on pin 1) and a 0.1 μF capacitor 86 and a 1 ohm resistor 88 (on pin 11). These circuits shunt high frequency oscillations in the voltages across terminals 1, 11. A 100 μF capacitor 90 is coupled between pins 10 and 11 of integrated circuit 54.

A frequency and level control generator for loudness compensation includes a series RC circuit coupled across the speaker assembly 38 terminals of integrated circuit 54. This circuit includes a series 100 ohm resistor 92 and a 22 μF capacitor 94. A full-wave bridge rectifier including diodes 96–99 is coupled across capacitor 94. A 47 μF capacitor 100 is coupled across the diode 96–99 bridge to store the rectified voltage variations appearing across capacitor 94. A 10K resistor 102 in parallel with a series circuit including a light emitting diode (LED) 104 and a current limiting resistor 106 is coupled across capacitor 100. LED 104 is positioned close to light sensitive resistor 64. The rectified voltage variations appearing across capacitor 94, and thus, the voltage variations above the cutoff frequency of the RC circuit comprising components 92, 94 appearing across the output terminals, pins 1 and 11 of integrated circuit 54, determine the resistance of light sensitive resistor 64. The cutoff frequency is determined by the values of resistor 92 and capacitor 94. The greater the amplitude of the low frequency components of the program material amplified by integrated circuit 54, the greater will be the rectified voltage appearing across capacitor 100, and therefore, the greater will be the light emitted by diode 104. The greater the light emitted by diode 104, the lower will be the resistance of light sensitive resistor 64. The lower the resistance of light sensitive resistor 64, the higher will be the frequency of the components of the signal appearing at input terminal 46 which reaches pin 6, the input terminal, of integrated circuit 54.

Figure 3:
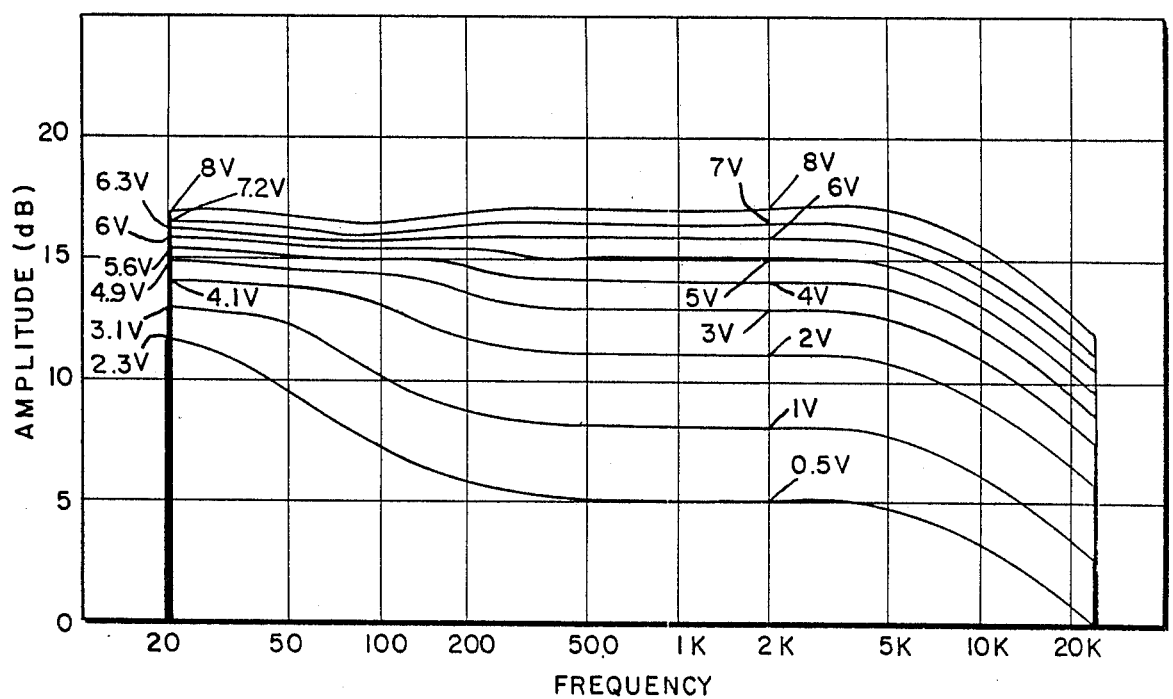
FIG. 3 illustrates the frequency response of a system constructed according to the present invention.

The loudness control provided by components 92, 94, 96–100, 102, 104, 106 and 64 enhances the sound quality at lower signal levels, that is, as determined by predetermined loudness contours, and the level of noise masking in the automobile environment. As illustrated in FIG. 3, for low-level signals (less than 2 v at 1 KHz), the responses of these signals rise below about 400 Hz. As the signal level increases, e.g., 3 v–8 v at 1 KHz, the amount of low frequency boost (boost below 400 Hz) is less. At the maximum power output of the integrated circuit 54 (at >8 v) the response is nearly flat. In fact, the low frequencies below about 200 Hz, may be cut at high levels (e.g., >8 v). This limits speaker 38 cone excursion to minimize distortion.

The circuit including components 48, 50, 52, 56, 58, 60, 61, 62, 63, 64 and 106 provides input equalization and the desired frequency response characteristics. This network includes a bass boost, a notch filter characteristic for equalizing out a vehicle interior resonance frequency peak, a band pass characteristic and a low-frequency boost/attenuation network. Illustrative values for the various components of this circuit for both front and rear channels for four 1986 Chrysler Corporation body styles are given in the following table.

type AN6551 dual amplifier. The pin numbers given in this description are for such a differential amplifier, although it is to be understood that any other suitable amplifier can be used. 68 K resistors are coupled between the + and − input terminals, pins 4 and 3, respectively, of amplifier 122 and the circuit's + and − input terminals 124, 126, respectively. Feedback is provided between the output terminal, pin 2, of amplifier 122 and its −input terminal through an RC parallel circuit including a 12 K resistor and a 0.0022 μF capacitor.

The output terminal of amplifier 122 is coupled through series capacitors 130, 132, 134 of 1 μF, 0.1 μF and 0.1 μF, respectively, to the + input terminal, pin 6, of a differential amplifier 128 in three-pole active filter 120. Amplifier 128 illustratively is the other half of the type AN6551 amplifier. Feedback is provided between the output terminal, pin 8, of amplifier 128 and its − input terminal, pin 7, through a 47 K resistor. The − input terminal of amplifier 128 is also coupled to the + input terminal of amplifier 122 through a 47 K series resistor 136 and a parallel RC circuit 138 including a 12 K resistor and a 0.0022 μF capacitor.

The junction of capacitors 130, 132 is coupled through a 4.7 K resistor to the junction of a parallel RC circuit 140 including a 1 K, ¼ watt resistor and a 100 μF capacitor, and a series RC circuit 142 including a 1K, ¼ watt resistor and 0.1 μF capacitor. The other terminal of each of circuits 140, 142 is grounded. The junction of the resistor and capacitor in circuit 142 is coupled to +V. The junction of capacitors 132, 134 is coupled through a 47 K resistor to the output terminal of amplifier 128. Another 47 K resistor is coupled between the + input terminal of amplifier 128 and the junction of resistor 136 and circuit 138.

The output terminal of amplifier 128 is coupled through a series circuit including a 1 μF capacitor 144, a resistor 148, a resistor 150 and a capacitor 152 to an input terminal, pin 6, of a power amplifier integrated circuit 154. Illustratively, integrated circuit 154 is a type uPC1230H2 amplifier available from NEC. The pin

| Component Number | 1986 Chrysler Corporation Body Style | | | | | | | |
| --- | --- | --- | --- | --- | --- | --- | --- | --- |
| | H Body | | S Body | | G Body | | E Body | |
| | Front | Rear | Front | Rear | Front | Rear | Front | Rear |
| 48 | 10K | 18K | 10K | 18K | 18K | 18K | 10K | 18K |
| 50 | 10K | 10K | 10K | 10K | 10K | 10K | 10K | 10K |
| 52 | 1 uF | 1 uF | 1 uF | 1 uF | 1 uF | 1 uF | 1 uF | 1 uF |
| 56 | .0022 uF | .033 uF | 300 pF | .0022 uF | .0022 uF | .0033 uF | .001 uF | .0022 uF |
| 58 | 47K | 10K | 100K | 47K | 100K | 47K | 68K | 47K |
| 60 | .02 uF | 0 | .047 uF | .022 uF | .01 uF | 0 | .022 uF | 0 |
| 61 | | | | | | 22K | | 47K | 10K |
| 62 | 3.3 uF | .68 uF | 3.3 uF | 1 nF | 1 uF | 2.2 uF | 3.3 uF | 1 uF |
| 63 | .15 uF | .1 uF | .022 uF | .022 uF | .068 uF | .47 uF | .047 uF | .022 uF |
| 64 | Clairex CLM 6000 560 South Third Avenue, Mt. Vernon, New York 10550 | | | | | | | |
| 106 | 1K | 2.2K | 3.9K | 4.7K | 3.3K | 3.3K | 2.2K | 3.3K |

Figure 4:
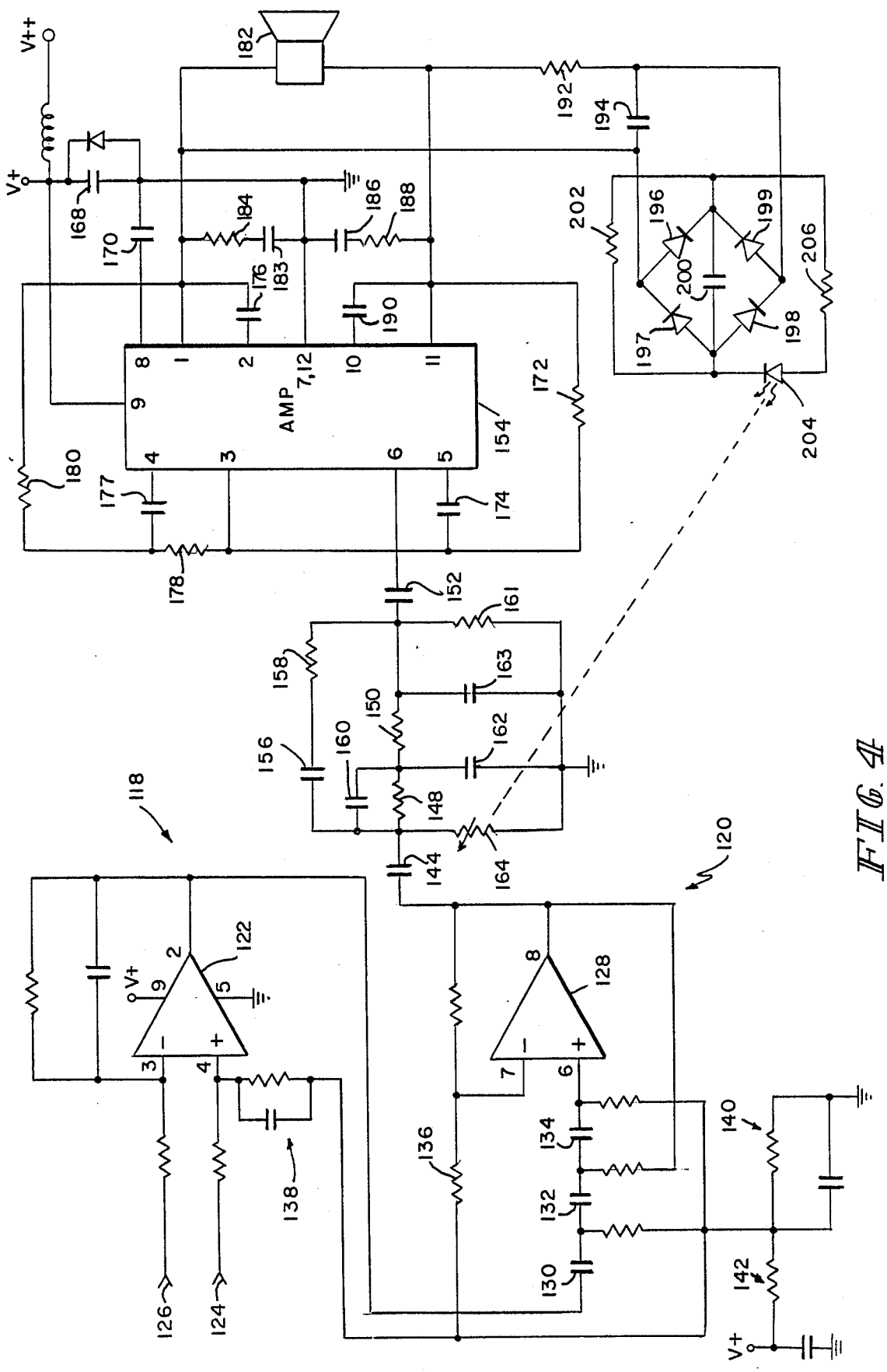
FIG. 4 illustrates a partly block and partly schematic diagram of another embodiment of a portion of the system illustrated in FIG. 1.

FIG. 4 illustrates a partly block and partly schematic diagram of another construction of one of the amplifiers 30, 32, 34, 36, illustratively amplifier 30. Again, it is to be understood that four such channels would be provided in a complete four-channel system.

In this emodiment, a differential input amplifier circuit 118 and a 33 Hz three-pole active filter 120 have been added in series before a tone equalization network similar to the network 48, 50, 52, 56, 58 and 60–64 in FIG. 2. The differential input amplifier circuit 118 includes a differential amplifier 122, such as one half of a numbers given in this description are for such an amplifier, although it is to be understood that any other suitable amplifier can be used.

A series RC circuit, including a capacitor 156 and a resistor 158, is coupled in parallel with the series components 148, 150. A capacitor 160 is coupled in parallel with resistor 148. A capacitor 162 is coupled from the common terminal of resistor 148, resistor 150 and capacitor 160 to ground. A light sensitive resistor 164, such as a Clairex CLM 6000 light sensitive resistor, is coupled from the common terminal of capacitor 144, resistor 148 and capacitors 156, 160 to ground. A parallel RC circuit including a resistor 161 and a capacitor 163 is coupled between the common terminal of resistors 150, 158 and capacitor 152 and ground.

Power is supplied from an unregulated +12 — — +16 VDC supply, such as an automobile battery, to the power supply terminal, pin 9, of integrated circuit 154. A 100 μF capacitor 168 is coupled between pin 9 and ground. A flyback diode is coupled across capacitor 168, with its anode coupled to ground and its cathode to V.

A 47 μF capacitor 170 is coupled between pin 8 of integrated circuit 154 and ground. A 1.5 K resistor 172 is coupled between pins 3 and 11 of integrated circuit 154. A 22 μF capacitor 174 is coupled between pins 3 and 5 of integrated circuit 154. A 100 μF capacitor 176 is coupled between pins 1 and 2 of integrated circuit 154. A 22 μF capacitor 177 and an 18 ohm resistor 178 are coupled in series between pins 3 and 4 of integrated circuit 154. A 3.3 K resistor 180 is coupled between pin 1 of integrated circuit 154 and the common terminal of capacitor 177 and resistor 178. Pins 7 and 12 of integrated circuit 154 are coupled to ground. A bass speaker assembly 182 is coupled across the output terminals, pins 1 and 11, of integrated circuit 154. Each of pins 1 and 11 is coupled to ground through a series RC circuit including a 0.1 μF capacitor 183 and a 2.2 ohm resistor 184 (on pin 1) and a 0.1 μF capacitor 186 and a 2.2 ohm resistor 188 (on pin 11). These circuits shunt high frequency oscillations in the voltages across terminals 1, 11. A 100 μF capacitor 190 is coupled between pins 10 and 11 of integrated circuit 54.

A frequency and level control generator for loudness compensation includes a series RC circuit coupled across the speaker assembly 182 terminals of integrated circuit 154. This circuit includes a series 100 ohm, ¼ watt resistor 192 and a 22 μF capacitor 194. A full-wave bridge rectifier including diodes 196-199 is coupled across capacitor 194. A 47 μF capacitor 200 is coupled across the diode 196-199 bridge to store the rectified voltage variations appearing across capacitor 194. A 10 K resistor 202 in parallel with a series circuit including an LED 204 and a current limiting resistor 206 is coupled across capacitor 200. LED 204 is positioned close to light sensitive resistor 164.

The rectified voltage variations appearing across capacitor 194, and thus, the voltage variations above the cutoff frequency of the RC circuit comprising components 192, 194 appearing across the output terminals, pins 1 and 11, of integrated circuit 154, determine the resistance of light sensitive resistor 164. The cutoff frequency is determined by the values of resistor 192 and capacitor 194. The greater the amplitude of the low frequency components of the program material amplified by integrated circuit 154, the greater will be the rectified voltage appearing across capacitor 200, and therefore, the greater will be the light emitted by diode 204. The greater the light emitted by diode 204, the lower will be the resistance of light sensitive resistor 164. The lower the resistance of light sensitive resistor 164, the higher will be the frequency of the components of the signal appearing across the input terminals of amplifier 122 which reaches pin 6, the input terminal, of integrated circuit 154.

The loudness control provided by components 192, 194, 196-200, 202, 204, 206 and 164 enhances the sound quality at lower signal levels, that is, as determined by predetermined loudness contours, and the level of noise masking in the automobile environment. As illustrated in FIG. 3, for low-level signals (less than 2 v at 1 KHz), the responses of these signals rise below about 400 Hz. As the signal level increases, e.g., 3 v–8 v at 1 KHz, the amount of low frequency boost (boost below 400 Hz) is less. At the maximum power output of the integrated circuit 154 (at 8 v) the response is nearly flat. In fact, the low frequencies below about 200 Hz, are cut at high levels (e.g., 8 v). This limits speaker 182 cone excursion to minimize distortion.

The circuit including components 144, 148, 150, 152, 156, 158, 160, 161, 162, 163, 164 and 206 provides input equalization and the desired frequency response characteristics. This network includes a bass boost, a notch filter characteristic for equalizing out a vehicle interior frequency peak, a band pass characteristic and a low-frequency boost/attenuation network.

What is claimed is:

1. In a sound system comprising a source of program material, a transducer, and means for coupling the transducer to the source to produce an audible signal related to the program material, the improvement comprising a controllable bass contour control network having a separate input and output, a power amplifier, a second transducer and a control circuit, means for coupling an input of the bass contour control network to the program material source, means for coupling an input of the power amplifier to an output of the bass contour control network, means for coupling the second transducer and the control circuit to the output of the power amplifier, an output of the control circuit being coupled to the bass contour control network, the control circuit controlling the contour of the signal supplied from the program material source through the bass contour control network to the power amplifier based upon the signal provided by the power amplifier to the control circuit, the bass contour control network comprising a light sensitive resistor, the control circuit comprising a light emitting device, and the control circuit being coupled to the bass contour control network by coupling light form the light emitting device to the light sensitive resistor, the control circuit further comprising an low pass filter, means for coupling the low pass filter across the output of the power amplifier, a rectifier, means for coupling the rectifier across the low pass filter, means for storing the rectified voltage variations appearing across the rectifier, means for coupling the storage means to the rectifier and current limiting means for coupling the light emitting device across the storage means to limit the light output from the light emitting device for a given stored energy in the storage means.

2. The apparatus of claim 1 wherein the controllable bass contour control network comprises a bass boost circuit.

3. The apparatus of claim 1 wherein the controllable bass contour control network comprises a band pass filter.

4. The apparatus of claim 1 wherein the controllable bass contour control network comprises a low frequency boost-attenuator.

5. The apparatus of claim 1 wherein the controllable bass contour control network comprises a notch filter.

6. In a sound system comprising a source of program material having a plurality of output channels, an equal plurality of transducers, means for coupling each of said output channels to a respective one of said transducers, the improvement comprising an equal plurality of variable bass contour control networks each having a separate input and output, an equal plurality of power amplifiers, an equal plurality of second transducers, an equal plurality of control circuits, means for coupling an input of each of said variable bass contour control networks to a respective one of said output channels, means for coupling an input of each of said power amplifiers to a respective output of one of said variable bass contour control networks, means for coupling each of said second transducers and each of said control circuits to a respective one of said power amplifiers, and an output of each of said control circuits being coupled to a respective one of said variable bass contour control networks, each control circuit controlling the contour of the signal supplied from a respective output channel through a respective variable contour control network to a respective power amplifier based upon the signal provided by the respective power amplifier to its respective control circuit, each said power amplifier comprises a pair of power amplifier output terminals and the means for coupling each said second transducers and each said control circuit to a respective power amplifier comprises means for coupling said transducer and control circuit in parallel across the respective power amplifier's output terminals, each bass contour control network comprises a light sensitive resistor, each control circuit comprises a light emitting device, and each control circuit being coupled to a respective bass contour control network by coupling light from the respective light emitting device to the respective light sensitive resistor, each control circuit further comprising a low pass filter, means for coupling the low pass filter across the respective power amplifier's output terminals, a rectifier, means for coupling the rectifier across the low pass filter, means for storing the rectified voltage variations appearing across the rectifier, means for coupling the storage means to the rectifier, and current limiting means for coupling the light emitting device across the storage means to limit the light output form the light emitting device for a given stored energy in the storage means.

* * * * *

UNITED STATES PATENT AND TRADEMARK OFFICE
CERTIFICATE OF CORRECTION

PATENT NO. : 4,809,338
DATED : February 28, 1989
INVENTOR(S) : William N. House

It is certified that error appears in the above-identified patent and that said Letters Patent is hereby corrected as shown below:

In the Abstract, at line 13, please delete "lower" and insert therefor --low--;

At column 3, line 13, after the word "designed", please insert --specifically--;

At column 3, line 49, after the word "diagram", please insert --of--;

At column 3, line 68, after the word "bass", please insert --speaker--;

At column 4, line 43, after "3.3K", please insert --resistor 80 is coupled between pin 1--;

At column 5, line 28, please delete "(at > 8 v)" and insert therefor --(at 8 v)--;

At column 7, line 11, please delete "V" and insert therefor --+V--; and

At column 8, line 42, please delete "an" and insert therefor --a--.

Signed and Sealed this

Fifteenth Day of August, 1989

Attest:

DONALD J. QUIGG

Attesting Officer

Commissioner of Patents and Trademarks